(12) United States Patent
Yang et al.

(10) Patent No.: US 11,996,844 B2
(45) Date of Patent: May 28, 2024

(54) DUTY CYCLE CORRECTION CIRCUIT AND METHOD OF OPERATING THE SAME

(71) Applicant: SK hynix Inc., Icheon-si (KR)

(72) Inventors: Dae Ho Yang, Icheon-si (KR); Min Su Kim, Icheon-si (KR); Kwan Su Shon, Icheon-si (KR); Keun Seon Ahn, Icheon-si (KR); Soon Sung An, Icheon-si (KR); Su Han Lee, Icheon-si (KR); Jae Hoon Jung, Icheon-si (KR); Kyeong Min Chae, Icheon-si (KR); Jae Hyeong Hong, Icheon-si (KR); Jun Sun Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/106,915

(22) Filed: Feb. 7, 2023

(65) Prior Publication Data
US 2024/0007085 A1    Jan. 4, 2024

(30) Foreign Application Priority Data
Jun. 29, 2022   (KR) .................. 10-2022-0079713

(51) Int. Cl.
*H03K 3/017*   (2006.01)
*H03K 5/05*    (2006.01)
*H03K 5/135*   (2006.01)
*H03K 5/156*   (2006.01)

(52) U.S. Cl.
CPC ............... *H03K 3/017* (2013.01); *H03K 5/05* (2013.01); *H03K 5/135* (2013.01); *H03K 5/1565* (2013.01)

(58) Field of Classification Search
None
See application file for complete search history.

(56) References Cited

U.S. PATENT DOCUMENTS

| 8,976,620 | B2   | 3/2015  | Huang |             |
| 9,985,522 | B1*  | 5/2018  | Luft  | H03K 5/1565 |
| 11,522,529| B2*  | 12/2022 | Yang  | H03K 5/1565 |
| 2017/0117887 | A1* | 4/2017 | Lee  | H03K 5/1565 |

FOREIGN PATENT DOCUMENTS

| KR | 100560660 B1  | 3/2006 |
| KR | 1020150128147 A | 11/2015 |

\* cited by examiner

*Primary Examiner* — Cassandra F Cox
(74) *Attorney, Agent, or Firm* — WILLIAM PARK & ASSOCIATES LTD.

(57) ABSTRACT

A duty cycle correction circuit includes a duty correction circuit, an information generation circuit and a duty control circuit. The duty correction circuit corrects a duty rate of an input clock signal based on a duty control code to generate an output clock signal. The information generation circuit compares a difference between operation power voltages based on an operation mode to generate voltage information. The duty control circuit receives the voltage information from the information generation circuit and generates the duty control code that includes the voltage information based on a duty rate of the output clock signal.

20 Claims, 7 Drawing Sheets

DUTY CYCLE CORRECTION CIRCUIT AND METHOD OF OPERATING THE SAME

CROSS-REFERENCES TO RELATED APPLICATION

The present application claims priority under 35 U.S.C. § 119(a) to Korean application number 10-2022-0079713, filed on Jun. 29, 2022, in the Korean Intellectual Property Office, which is incorporated herein by reference in its entirety.

BACKGROUND

1. Technical Field

Various embodiments generally relate to a semiconductor integrated circuit device and a method of operating the same, more particularly, to a duty cycle correction circuit of a semiconductor integrated circuit device and a method of operating the duty cycle correction circuit.

2. Related Art

Generally, a semiconductor device such as a double data rate (DDR) DRAM may receive and output data based on a rising edge and a falling edge of a clock signal. When a duty rate of the clock signal may be greatly beyond about 50:50, the semiconductor device might not receive and output the data based on the clock signal. Thus, the semiconductor device may include a duty cycle correction circuit configured to correct the duty rate of the clock signal into 50:50.

The duty cycle correction circuit may control the duty rate of the clock signal as 50:50 by a duty training operation mode. The controlled clock signal may normally maintain the duty rate. However, the duty cycle correction circuit might not generate the clock signal having a desired duty rate due to various reasons.

Particularly, the duty cycle correction circuit may control the duty rate of the clock signal as 50:50 by the duty training operation mode. The semiconductor device may then perform a normal operation mode such as a read operation, a write operation, etc., based on the clock signal. In this operation, the duty rate of the clock signal may be maintained as 50:50. However, because an operation power voltage may be used in the normal operation mode, the operation power voltage in the duty training operation mode may be different from the operation power voltage in the normal operation mode. Thus, although the duty rate of the clock signal may be controlled to be 50:50 by the duty training operation mode, the duty rate of the clock signal in the normal operation mode may be changed. As a result, the semiconductor device may malfunction so that a desired operation in the normal operation mode might not effectively performed due the clock signal having the changed duty rate.

SUMMARY

According to example embodiments, there may be provided a duty cycle correction circuit. The duty cycle correction circuit may include a duty correction circuit, an information generation circuit and a duty control circuit. The duty correction circuit may correct a duty rate of an input clock signal based on a duty control code to generate an output clock signal. The information generation circuit may compare a difference between operation power voltages with each other based on an operation mode to generate voltage information. The duty control circuit may receive the voltage information from the information generation circuit and may generate the duty control code that includes the voltage information based on a duty rate of the output clock signal.

According to example embodiments, there may be provided a duty cycle correction circuit. The duty cycle correction circuit may include a duty correction circuit and a duty control circuit. The duty correction circuit may correct a duty rate of an input clock signal based on a duty control code to generate an output clock signal. The duty control circuit may generate the duty control code based on a duty rate of the output clock signal, the duty control code including a difference between operation power voltages on the duty control code based on an operation mode.

According to example embodiments, there may be provided a method of operation a duty cycle correction circuit. In the method of operating the duty cycle correction circuit, a duty training operation with respect to an input clock signal may be performed. An operation power voltage in the duty training operation may be compared with an operation power voltage in at least one normal operation. A duty cycle correction operation based on the comparison result may be performed to generate an output clock signal having a corrected duty rate with respect to the input clock signal.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
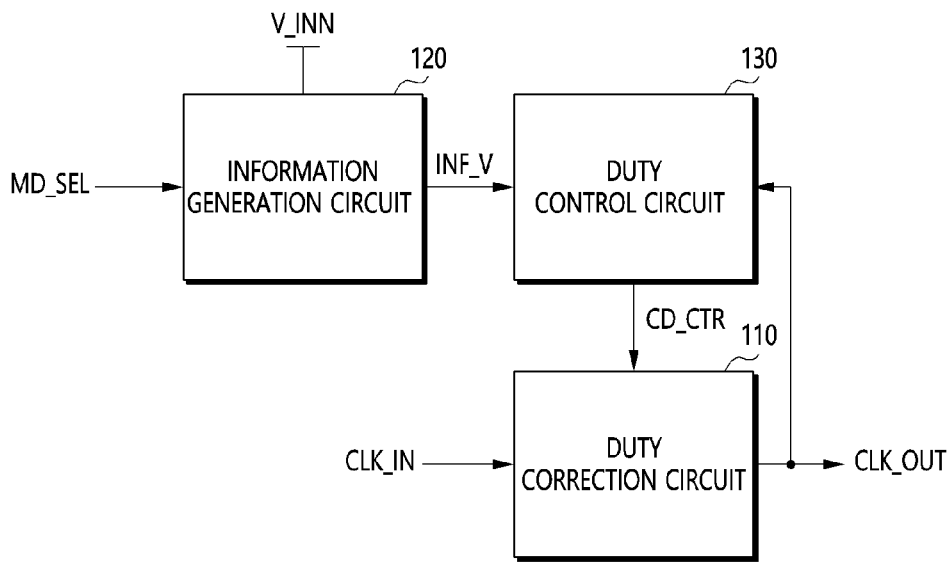
FIG. 1 is a block diagram illustrating a duty cycle correction circuit in accordance with example embodiments.

FIG. 1 is a block diagram illustrating a duty cycle correction circuit in accordance with example embodiments.

Referring to FIG. 1, a duty cycle correction circuit 100 may correct a duty rate of an input clock signal CLK_IN to generate an output clock signal CLK_OUT. Particularly, the duty cycle correction circuit 100 may include a duty correction circuit 110, an information generation circuit 120, and a duty control circuit 130.

The duty correction circuit 110 may correct the duty rate of the input clock signal CLK_IN based on a duty control code CD_CTR to generate the output clock signal CLK_OUT. The duty correction circuit 110 may control drive forces corresponding to a rising edge and a falling edge of the input clock signal CLK_IN based on the duty control code CD_CTR. Thus, the duty correction circuit 110 may generate the output clock signal CLK_OUT having the duty rate of about 50:50 based on the duty control code CD_CTR.

The information generation circuit 120 may compare differences between operation power voltages V_INN based on operation modes to generate voltage information INF_V. The information generation circuit 120 may receive a mode selection signal MD_SEL corresponding to the operation mode.

The operation mode may include a duty training operation mode and at least one normal operation mode. The duty training operation mode may include an operation for setting a duty rate of the output clock signal CLK_OUT corresponding to the input clock signal CLK_IN before the normal operation mode. The normal operation mode may include a high power operation and a low power operation. The high power operation may consume a relatively high amount of the operation power voltage V_INN. The high power operation may include a read operation and a write operation. The low power operation may consume a relatively low amount of the operation power voltage V_INN. The low power operation may include a standby operation and a power-down operation.

The operation power voltage V_INN in the high power operation may become lower than the operation power voltage V_INN in the duty training operation mode. The operation power voltage in the low power operation may become higher than the operation power voltage V_INN in the duty training operation mode. Thus, the voltage information INF_V may include information corresponding to the difference between the operation power voltage V_INN that is applied in the duty training operation mode and the operation power voltage V_INN that is applied to the at least one normal operation mode.

The duty control circuit 130 may generate the duty control code CD_CTR based on the duty rate of the output clock signal CLK_OUT. The duty control circuit 130 may receive the voltage information INF_V that is output from the information generation circuit 120 and may output the duty control code CD_CTR that includes the voltage information INF_V.

According to example embodiments, the duty cycle correction circuit 100 may include, in the duty control code CD_CTR, the voltage difference that is generated in the operation power voltage V_INN based on the operation mode to perform a duty cycle correction operation. Thus, in the at least one normal operation mode, the duty cycle correction circuit 100 may control, at a minimum, the duty control code CD_CTR, which may be set in the duty training operation mode, to perform the duty cycle correction operation. As a result, the duty cycle correction circuit 100 may rapidly and accurately generate the output clock signal CLK_OUT having the desired duty rate in the at least one normal operation mode.

Figure 2:
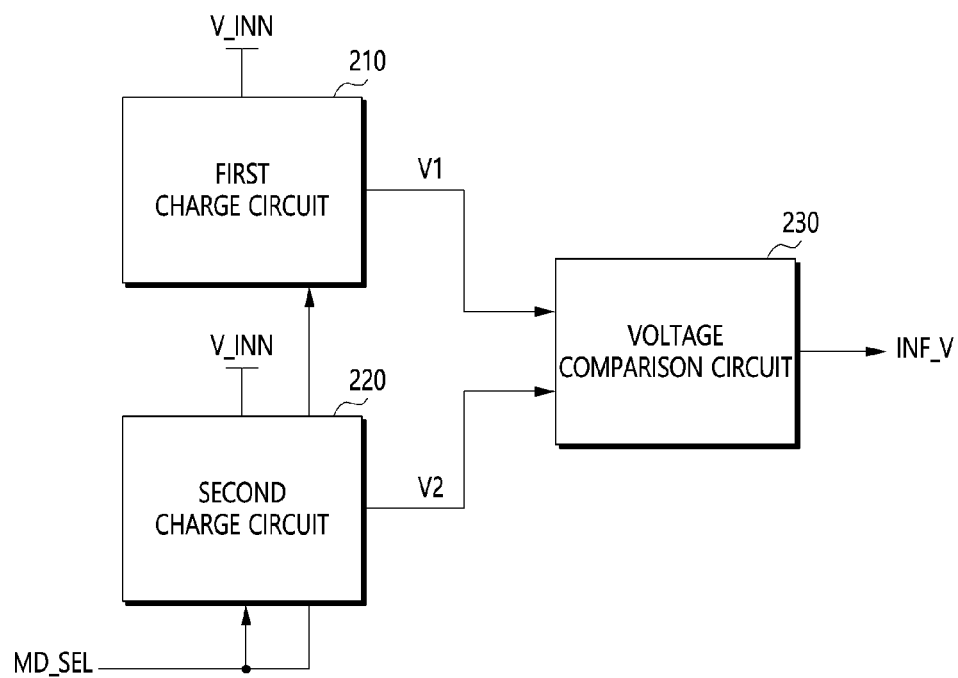
FIG. 2 is a block diagram illustrating an information generation circuit in FIG. 1.

FIG. 2 is a block diagram illustrating an information generation circuit in FIG. 1.

Referring to FIG. 2, the information generation circuit 120 may include a first charge circuit 210, a second charge circuit 220, and a voltage comparison circuit 230.

The first charge circuit 210 may store the operation power voltage V_INN as a first storage voltage V1 through a charge operation in the duty training operation mode. The first charge circuit 210 may be activated in the duty training operation mode based on the mode selection signal MD_SEL. The first charge circuit 210 may include a capacitor configured to store the operation power voltage V_INN in the duty training operation mode. Thus, the capacitor in the first charge circuit 210 may store the operation power voltage V_INN in the duty training operation mode. The first charge circuit 210 may output the stored voltage as the first storage voltage V1.

The second charge circuit 220 may store the operation power voltage V_INN as a second storage voltage V2 through a charge operation in the at least one normal operation mode. The second charge circuit 220 may be activated in the at least one normal operation mode based on the mode selection signal MD_SEL. The second charge circuit 220 may include a capacitor similarly to the first charge circuit 210. Thus, the capacitor in the second charge circuit 220 may store the operation power voltage V_INN in the at least one normal operation mode. The second charge circuit 220 may output the stored voltage as the second storage voltage V2.

The voltage comparison circuit 230 may compare the first storage voltage V1 with the second storage voltage V2 to generate the voltage information INF_V. The voltage comparison circuit 230 may compare the first storage voltage V1 that is output from the first charge circuit 210 to the second storage voltage V2 that is output from the second charge circuit 220 to generate the voltage information INF_V corresponding to the voltage difference.

The first storage voltage V1 may correspond to the operation power voltage V_INN in the duty training operation mode. The second storage voltage V2 may correspond to the operation power voltage V_INN in the at least one normal operation mode. Therefore, the voltage comparison circuit 230 may compare the operation power voltage V_INN in the duty training operation mode to the operation power voltage V_INN in the at least one normal operation mode.

The voltage information INF_V that is generated from the voltage comparison circuit 230 may include information that is obtained by comparing the operation power voltage V_INN in the duty training operation mode to the operation power voltage V_INN in the at least one normal operation mode. The voltage information INF_V may then be provided to the duty control circuit 130 in FIG. 1.

Hereinafter, an operation of the duty cycle correction circuit 100, in accordance with example embodiments, may be illustrated with reference to FIGS. 1 and 2.

The duty cycle correction circuit 100 may receive the input clock signal CLK_IN in the duty training operation mode. The duty rate of the input clock signal CLK_IN might not be about 50:50. Thus, the duty control circuit 130 may generate the duty control code CD_CTR based on the duty rate of the output clock signal CLK_OUT. The duty correction circuit 110 may correct the duty rate of the input clock signal CLK_IN based on the duty control code CD_CTR. As a result, the duty correction circuit 110 may generate the output clock signal CLK_OUT having the duty rate of about 50:50 in the duty training operation mode. The first charge circuit 210 may store the operation power voltage V_INN as the first storage voltage V1 in the duty training operation mode.

The second charge circuit 220 may store the operation power voltage V_INN as the second storage voltage V2 in the at least one normal operation mode. The voltage comparison circuit 230 may compare the first storage voltage V1 that is stored in the duty training operation mode to the second storage voltage V2 that is stored in the at least one normal operation mode to generate the voltage information INF_V. The duty control circuit 130 may include the voltage information INF_V, in the duty control code CD_CTR, to generate the duty control code CD_CTR. The duty correction circuit 110 may re-correct the duty rate of the input clock signal CLK_IN based on the duty control code CD_CTR. As a result, the duty correction circuit 110 may generate the output clock signal CLK_OUT having the duty rate of about 50:50 in the at least one normal operation mode.

Therefore, the duty cycle correction circuit 100 may include, in the duty control code CD_CTR, the difference between the operation power voltage V_INN in the duty training operation mode and the operation power voltage V_INN in the at least one normal operation mode to rapidly and accurately perform the duty cycle correction operation.

In example embodiment, the information generation circuit 120 may include a plurality of second charge circuits 220 corresponding to a plurality of the normal operation modes, respectively. The mode selection signal MD_SEL may be selectively activated based on each of the normal operation modes. Thus, although not depicted in drawings, each of the second charge circuits 220 may store the storage voltage corresponding to each of the normal operation modes.

In this case, the voltage comparison circuit 230 may compare the storage voltages corresponding to the duty training operation mode and the normal operation modes with each other. Thus, the duty cycle correction circuit 100 may perform the duty cycle correction operation corresponding to each of the normal operation modes based on the first storage voltage V1 corresponding to each of the normal operation modes. Further, the duty cycle correction circuit 100 may perform the duty cycle correction operation corresponding to other normal operation modes based on the storage voltage corresponding to at least one among the normal operation modes.

The duty control circuit 130 may generate the duty control code CD_CTR through a charge/discharge operation. The duty control circuit 130 may include a capacitor configured to perform the charge/discharge operation. The capacitor may store the duty voltage in the duty training operation mode. Thus, the capacitor of the duty control circuit 130 may commonly share the capacitor corresponding to at least one of the first charge circuit 210 and the second charge circuit 220. That is, the shared capacitor may store the first storage voltage V1 corresponding to the duty training operation mode or the second storage voltage V2 corresponding to the at least one normal operation mode. As a result, the duty cycle correction circuit 100 of example embodiments may have the simple structure.

Hereinafter, structures for commonly sharing the capacitor may be exemplarily explained in detail.

Figure 3:
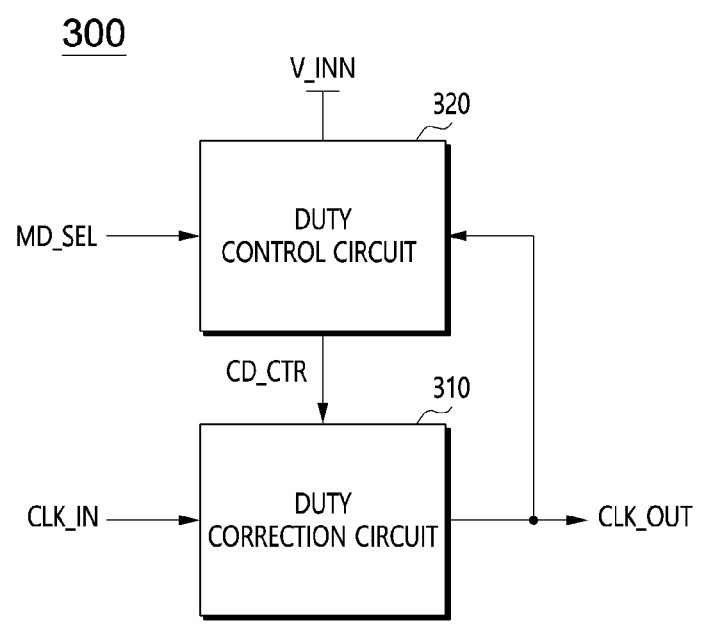
FIG. 3 is a block diagram illustrating a duty cycle correction circuit in accordance with example embodiments.

FIG. 3 is a block diagram illustrating a duty cycle correction circuit in accordance with example embodiments.

Referring to FIG. 3, a duty cycle correction circuit 300 may include a duty correction circuit 310 and a duty control circuit 320.

The duty correction circuit 310 may correct a duty rate of an input clock signal CLK_IN based on a duty control code CD_CTR to generate an output clock signal CLK_OUT.

The duty control circuit 320 may generate the duty control code CD_CTR based on a duty rate of the output clock signal CLK_OUT. Based on an operation mode, the duty control circuit 320 may include, in the duty control code CD_CTR, a difference between operation power voltages V_INN.

According to example embodiments, based on the operation mode, the duty cycle correction circuit 300 may include, in the duty control code CD_CTR, the difference between the operation power voltages V_INN to perform a duty cycle correction operation. Thus, in the at least one normal operation mode, the duty cycle correction circuit 300 may control at a minimum the duty control code CD_CTR, which may be set in the duty training operation mode, to perform the duty cycle correction operation. As a result, the duty cycle correction circuit 300 may rapidly and accurately generate the output clock signal CLK_OUT having the desired duty rate in the at least one normal operation mode.

Figure 4:
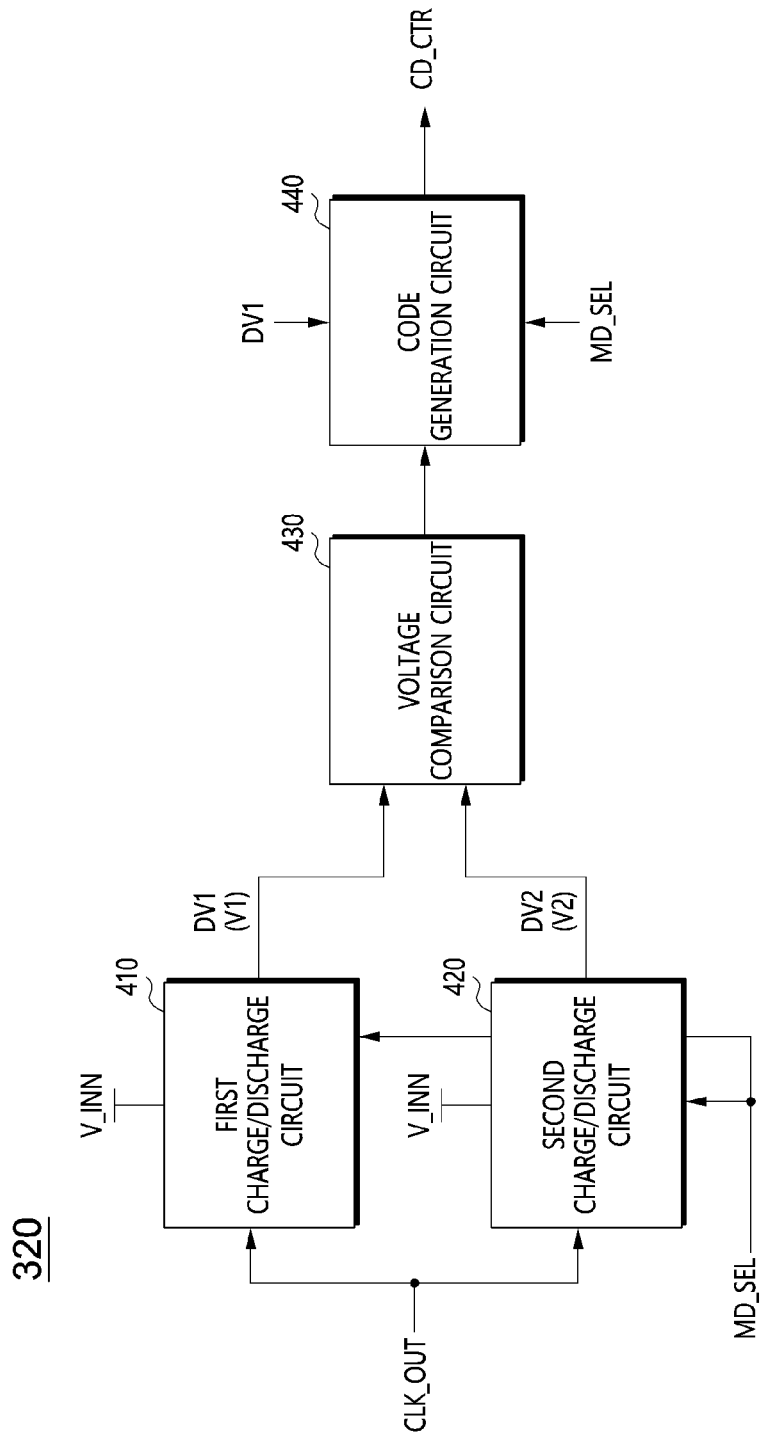
FIG. 4 is a block diagram illustrating a duty control circuit in FIG. 3.

FIG. 4 is a block diagram illustrating a duty control circuit in FIG. 3.

Referring to FIG. 4, the duty control circuit 320 may include a first charge/discharge circuit 410, a second charge/discharge circuit 420, a voltage comparison circuit 430, and a code generation circuit 440.

The first charge/discharge circuit 410 may store the duty rate of the output clock signal CLK_OUT as a first duty voltage V1 through a charge/discharge operation in the duty training operation mode. The first charge/discharge circuit 410 may be activated in the duty training operation mode based on the mode selection signal MD_SEL. The first charge/discharge circuit 410 may include a capacitor configured to perform the charge/discharge operation based on the output clock signal CLK_OUT. Thus, the capacitor in the first charge/discharge circuit 410 may store a voltage corresponding to the duty rate of the output clock signal CLK_OUT during a predetermined section in the duty training operation mode. The first charge/discharge circuit 410 may output the voltage that is stored in the capacitor as the first duty voltage V1.

The second charge/discharge circuit 420 may store the duty rate of the output clock signal CLK_OUT as a second duty voltage V2 through a charge/discharge operation in the at least one normal operation mode. The second charge/discharge circuit 420 may be activated in the at least one normal operation mode based on the mode selection signal MD_SEL. The second charge/discharge circuit 420 may include a capacitor similarly to the first charge/discharge circuit 410. Thus, the capacitor in the second charge/discharge circuit 420 may store a voltage corresponding to the duty rate of the output clock signal CLK_OUT during a predetermined section in the at least one normal operation mode. The second charge/discharge circuit 420 may output the voltage that is stored in the capacitor as the second duty voltage V2.

The voltage comparison circuit 430 may compare the first duty voltage V1 with the second duty voltage V2. The voltage comparison circuit 430 may compare the first duty voltage V1 that is output from the first charge/discharge circuit 410 with the second duty voltage V2 that is output from the second charge/discharge circuit 420 to generate an output signal corresponding to the voltage difference.

The first duty voltage V1 may correspond to the duty rate of the output clock signal CLK_OUT based on the operation power voltage V_INN in the duty training operation mode. The second duty voltage V2 may correspond to the duty rate of the output clock signal CLK_OUT based on the operation power voltage V_INN in the at least one normal operation mode. Therefore, the voltage comparison circuit 430 may compare the operation power voltage V_INN in the duty training operation mode with the operation power voltage V_INN in the at least one normal operation mode through the first duty voltage V1 and the second duty voltage V2.

The code generation circuit 440 may code the output signal of the voltage comparison circuit 430 to generate the duty control code CD+CTR. The duty control code CD_CTR that is generated from the code generation circuit 440 may be provided to the duty correction circuit 310 in FIG. 3. The duty correction circuit 310 may correct the duty rate of the input clock signal CLK_IN based on the duty control code CD_CTR to output the output clock signal CLK_OUT.

The code generation circuit 440 may code the first duty voltage V1 in the duty training operation mode to generate the duty control code CD_CTR. The code generation circuit 440 may include, in the duty control code CD_CTR, the difference between the first duty voltage V1 and the second duty voltage V2 in the at least one normal operation mode to code the duty control code CD_CTR. That is, only the duty cycle correction operation, which may correspond to the difference between the first duty voltage V1 and the second duty voltage V2, may be performed in the at least one normal operation mode. Thus, the duty control circuit 320 may perform a minimum control operation with respect to the duty control code CD_CTR in the at least one normal operation mode after the duty training operation mode.

The duty cycle correction circuit 300 in FIG. 4 may store the duty rate of the output clock signal CLK_OUT corresponding to the operation power voltage V_INN as the first duty voltage V1 in the duty training operation mode through the charge/discharge operation. The duty cycle correction circuit 300 may store the duty rate of the output clock signal CLK_OUT corresponding to the operation power voltage V_INN as the second duty voltage V2 in the at least one normal operation mode through the charge/discharge operation. The duty cycle correction circuit 300 may perform the duty cycle correction operation by comparing the first duty voltage V1 with the second duty voltage V2. Thus, the duty cycle correction circuit 300 may complete the duty cycle correction operation through a minimum control operation with respect to the duty control code CD_CTR in the at least one normal operation mode after the duty training operation mode to minimize a time for correcting the duty cycle.

The second charge/discharge circuit 420 may include a plurality of circuits corresponding to a plurality of the normal operation modes. The mode selection signal MD_SEL may be selectively activated based on each of the normal operation modes. Thus, although not depicted in drawings, each of the second charge/discharge circuits 220 may store the storage voltage corresponding to each of the normal operation modes.

In this case, the voltage comparison circuit 430 may compare the duty voltages corresponding to the duty training operation mode and the normal operation modes with each other. Thus, the duty cycle correction circuit 300 may perform the duty cycle correction operation corresponding to each of the normal operation modes based on the first duty voltage V1 corresponding to each of the normal operation modes. Further, the duty cycle correction circuit 300 may perform the duty cycle correction operation corresponding to other normal operation modes based on the duty voltage corresponding to at least one among the normal operation modes.

In example embodiments, the first and second charge/discharge circuits 410 and 420 may store the first and second duty voltage DV1 and DV2 to perform the duty cycle correction operation, not limited thereto. For example, the first charge/discharge circuit 410 may store the first duty voltage DV1 for the duty training operation mode. Alternatively, as shown in FIGS. 1 and 2, the first charge/discharge circuit 410 may store the first storage voltage V1 corresponding to the operation power voltage V_INN in the duty training operation mode. Further, the second charge/discharge circuit 440 may store the second duty voltage DV2 for the at least one normal operation mode. Alternatively, as shown in FIGS. 1 and 2, the second charge/discharge circuit 420 may store the second storage voltage V2 corresponding to the operation power voltage V_INN in the at least one normal operation mode. Thus, the voltage comparison circuit 430 may compare the first storage voltage V1 with the second storage voltage V2 in the duty cycle correction operation with respect to the at least one normal operation mode. This may be embodied because the first and second duty voltages DV1 and DV2 and the first and second storage voltages V1 and V2 may include information with respect to the operation power voltage V_INN of each of the operation modes.

Figure 5:
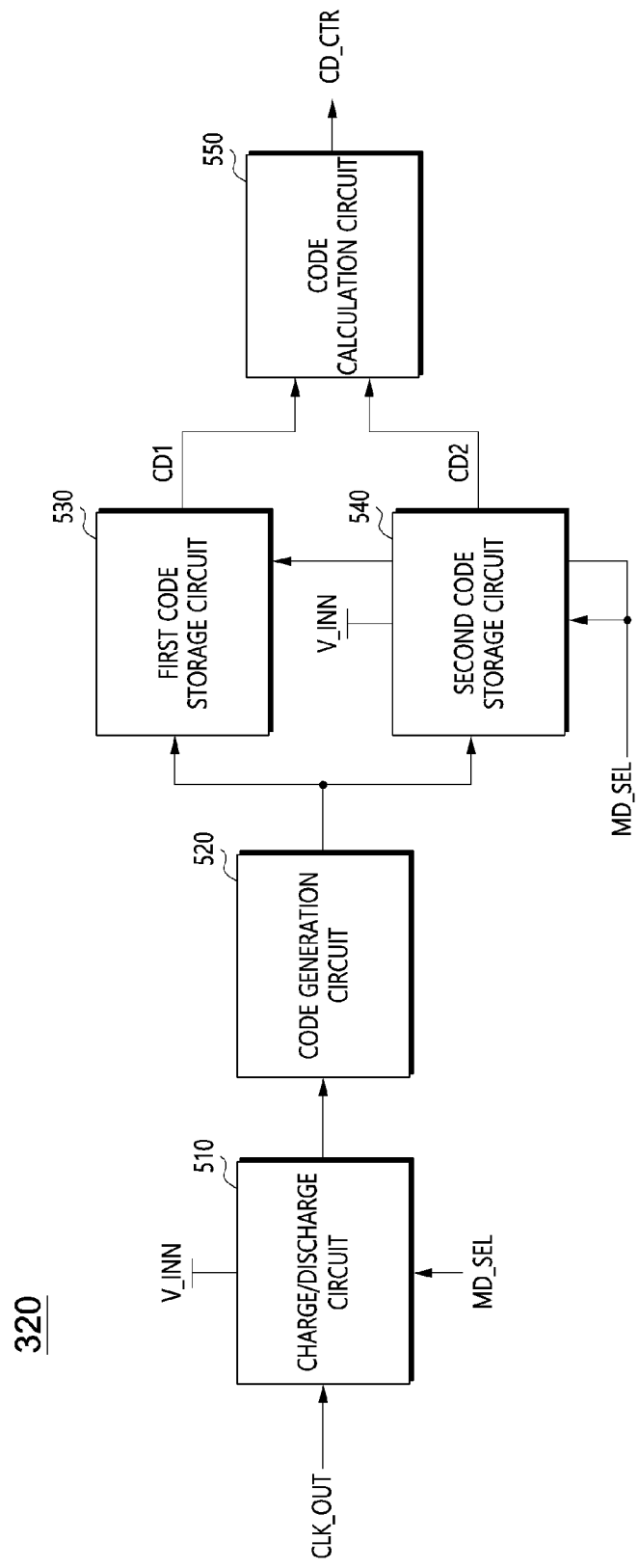
FIG. 5 is a block diagram illustrating a duty control circuit in FIG. 3.

FIG. 5 is a block diagram illustrating a duty control circuit in FIG. 3.

Referring to FIG. 5, the duty control circuit 320 may include a charge/discharge circuit 510, a code generation circuit 520, a first code storage circuit 530, a second code storage circuit 540, and a code calculation circuit 550.

The charge/discharge circuit 510 may store the duty rate of the output clock signal CLK_OUT through a charge/discharge operation in the duty training operation mode. The charge/discharge circuit 510 may be activated in the duty training operation mode and the at least one normal operation mode based on the mode selection signal MD_SEL. The charge/discharge circuit 510 may include a capacitor configured to perform the charge/discharge operation based on the output clock signal CLK_OUT. Thus, the charge/discharge circuit 510 may sequentially store voltages corresponding to the duty rate of the output clock signal CLK_OUT during a predetermined section in the duty training operation mode and the at least one normal operation mode.

The code generation circuit 520 may code the output voltage of the charge/discharge circuit 510. The code generation circuit 520 may be embodied by various example embodiments for generating a code corresponding to an input voltage.

The first code storage circuit 530 may store an output code of the code generation circuit 520 as a first duty code CD1 in the duty training operation mode. The first code storage circuit 530 may be activated in the duty training operation mode based on the mode selection signal MD_SEL. The first code storage circuit 530 may include a storage circuit, such as a latch, a register, etc. Thus, the first code storage circuit 530 may store a code corresponding to the duty rate of the output clock signal CLK_OUT in the duty training operation mode. The first code storage circuit 530 may then output the stored code as the first duty code DC1.

The second code storage circuit 540 may store an output code of the code generation circuit 520 as a second duty code CD2 in the at least one normal operation mode. The second code storage circuit 540 may be activated in the at least one normal operation mode based on the mode selection signal MD_SEL. The second code storage circuit 540 may include a storage circuit, such as a latch, a register, etc., similarly to the first code storage circuit 530. Thus, the second code storage circuit 540 may store a code corresponding to the duty rate of the output clock signal CLK_OUT in the at least one normal operation mode. The second code storage circuit 540 may then output the stored code as the second duty code DC2.

The code calculation circuit 550 may calculate the first and second duty codes CD1 and CD2 to generate the duty control code CD_CTR. The code calculation circuit 550 may calculate the first duty code CD1 that is output from the first code storage circuit 530 and the second duty code CD2 that is output from the second code storage circuit 540 to generate the duty control code CD_CTR.

The first duty code CD1 may be a code corresponding to the duty rate of the output clock signal CLK_OUT based on the operation power voltage V_INN in the duty training operation mode. The second duty code CD2 may be a code corresponding to the duty rate of the output clock signal CLK_OUT based on the operation power voltage V_INN in the at least one normal operation mode. As a result, the code calculation circuit 550 may calculate a difference between the operation power voltage V_INN in the duty training operation mode and the operation power voltage V_INN in the at least one normal operation mode to generate the duty control code CD_CTR.

The duty cycle correction circuit 300, in FIG. 5, may store the duty rate of the output clock signal CLK_OUT corresponding to the operation power voltage V_INN as the first duty code CD1 in the duty training operation mode through the coding operation. The duty cycle correction circuit 300 may store the duty rate of the output clock signal CLK_OUT corresponding to the operation power voltage V_INN as the second duty code CD2 in the at least one normal operation mode through the coding operation. The duty cycle correction circuit 300 may perform the duty cycle correction operation based on the code calculation with respect to the first code CD1 and the second code CD2. Thus, the duty cycle correction circuit 300 may complete the duty cycle correction operation through a minimum control operation with respect to the duty control code CD_CTR in the at least one normal operation mode after the duty training operation mode to minimize a time for correcting the duty cycle.

The second code storage circuit 540 may include a plurality of circuits corresponding to a plurality of the normal operation modes. The mode selection signal MD_SEL may be selectively activated based on each of the normal operation modes. Thus, although not depicted in drawings, each of the second code storage circuits 540 may store the duty code corresponding to each of the normal operation modes.

In this case, the code calculation circuit 550 may calculate the duty codes corresponding to the duty training operation mode and the normal operation modes. Thus, the duty cycle correction circuit 300 may perform the duty cycle correction operation corresponding to each of the normal operation modes based on the first duty code CD1 corresponding to each of the normal operation modes. Further, the duty cycle correction circuit 300 may perform the duty cycle correction operation corresponding to other normal operation modes based on the duty voltage corresponding to at least one among the normal operation modes.

In example embodiments, the first and second code storage circuits 530 and 540 may store the first and second duty codes CD1 and CV2 to perform the duty cycle correction operation. However, the present disclosure is not limited thereto. For example, the first code storage circuit 530 may store the first duty code CD1 for the duty training operation mode. Alternatively, the first code storage circuit 530 may code and store the first storage voltage V1 corresponding to the duty training operation mode. Further, the second code storage circuit 540 may store the second duty code CD2 for the at least one normal operation mode. Alternatively, the second code storage circuit 540 may store the second storage voltage V2 corresponding to the at least one normal operation mode. Thus, the code calculation circuit 550 may calculate the coded first and second storage voltages V1 and V2. This may be embodied because the first and second duty codes CV1 and CV2 and the first and second storage voltages V1 and V2 may include information with respect to the operation power voltage V_INN of each of the operation modes.

Figure 6:
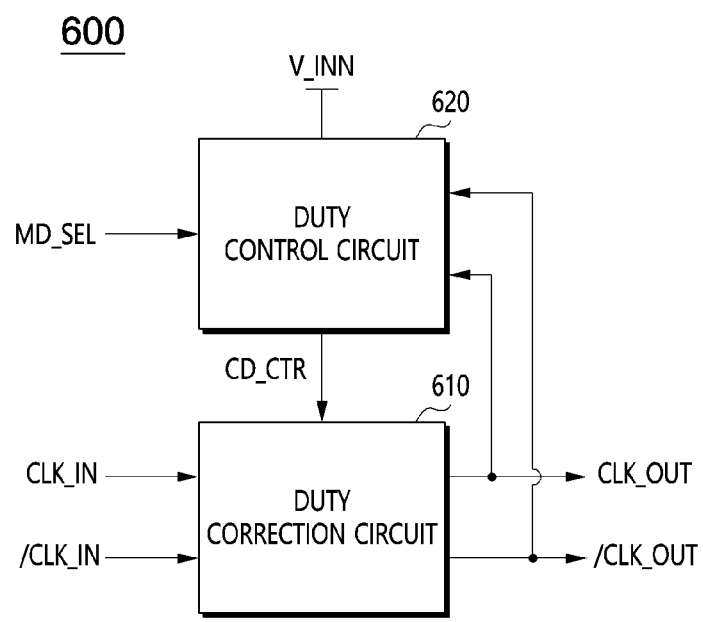
FIG. 6 is a block diagram illustrating a duty cycle correction circuit in accordance with example embodiments.

FIG. 6 is a block diagram illustrating a duty cycle correction circuit in accordance with example embodiments.

Referring to FIG. 6, a duty cycle correction circuit 600 may include a duty correction circuit 610 and a duty control circuit 620.

The duty correction circuit 610 may correct a duty rate of input clock signals CLK_IN and /CLK_IN based on a duty control code CD_CTR to generate output clock signals CLK_OUT and /CLK_OUT. The input clock signals CLK_IN and /CLK_IN may include a positive input clock signal CLK_IN and a negative input clock signal /CLK_IN. The positive input clock signal CLK_IN and the negative input clock signal /CLK_IN may have opposite phases. The output clock signals CLK_OUT and /CLK_OUT may include a positive output clock signal CLK_OUT and a negative output clock signal /CLK_OUT. The positive output clock signal CLK_OUT and the negative output clock signal /CLK_OUT may have opposite phases. Thus, the duty correction circuit 610 may correct the duty rate of the positive and negative input clocks signals CLK_IN and /CLK_IN based on the duty control code CD_CTR to generate the positive and negative output clock signals CLK_OUT and /CLK_OUT.

The duty control circuit 620 may generate the duty control code CD_CTR based on the mode selection signal MD_SEL corresponding to the duty training operation mode and the at least one normal operation mode. Particularly, the duty control circuit 620 may compare the duty rate of the positive output clock signal CLK_OUT to the duty rate of the negative output clock signal /CLK_OUT in the duty training operation mode to generate the duty control code CD_CTR. In the at least one normal operation mode, the duty control circuit 620 may include, in the duty control code CD_CTR, a difference between operation power voltages V_INN in the duty training operation mode and the at least one normal operation mode.

According to example embodiments, the duty cycle correction circuit 300 may include, in the duty control code CD_CTR, the difference between the operation power voltages V_INN based on the operation mode to perform a duty cycle correction operation. Thus, in the at least one normal operation mode, the duty cycle correction circuit 300 may control at a minimum the duty control code CD_CTR, which may be set in the duty training operation mode, to perform the duty cycle correction operation. As a result, the duty cycle correction circuit 300 may rapidly and accurately generate the output clock signal CLK_OUT having the desired duty rate in the at least one normal operation mode.

Figure 7:
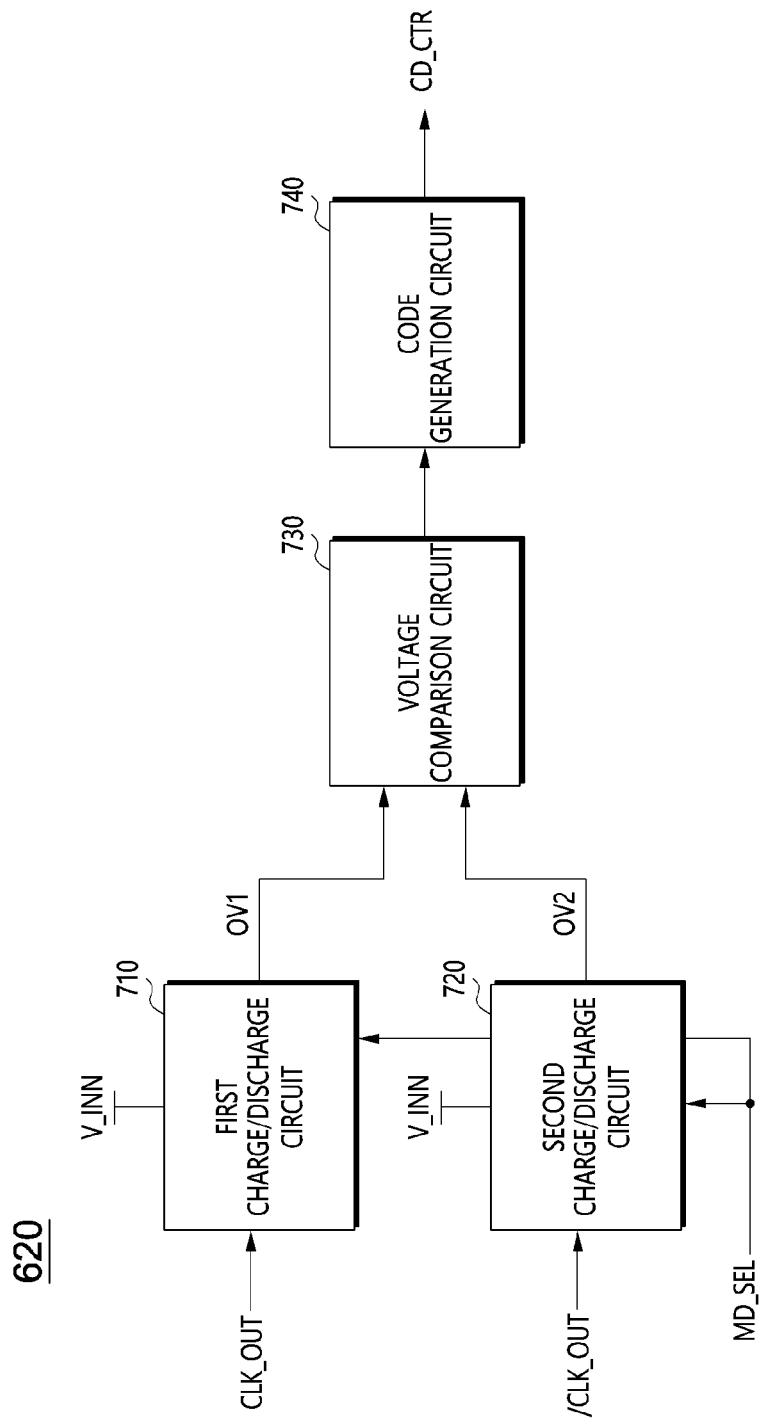
FIG. 7 is a block diagram illustrating a duty control circuit in FIG. 6.

FIG. 7 is a block diagram illustrating a duty control circuit in FIG. 6.

Referring to FIG. 7, the duty control circuit 620 may include a first charge/discharge circuit 710, a second charge/discharge circuit 720, a voltage comparison circuit 730, and a code generation circuit 740.

The first charge/discharge circuit 710 may store the duty rate of the positive output clock signal CLK_OUT as a first output voltage OV1 through a charge/discharge operation in the duty training operation mode. The first output voltage OV1 may include a voltage corresponding to the duty rate of the positive output clock signal CLK_OUT based on the operation power voltage V_INN in the duty training operation mode.

The second charge/discharge circuit 720 may store the duty rate of the negative output clock signal /CLK_OUT as a second output voltage OV2 through a charge/discharge operation in the duty training operation mode. The second output voltage OV2 may include a voltage corresponding to the duty rate of the negative output clock signal /CLK_OUT based on the operation power voltage V_INN in the duty training operation mode.

The voltage comparison circuit 730 may compare the first output voltage OV1 to the second output voltage OV2. The voltage comparison circuit 730 may compare the first output voltage OV1 that is stored in the first charge/discharge circuit 710 with the second output voltage OV2 that is stored in the second charge/discharge circuit 720 to generate an output signal corresponding to the voltage difference.

The code generation circuit 740 may be configured to generate the duty control code CD_CTR by coding the output signal of the voltage comparison circuit 730. The duty control code CD_CTR that is generated from the code generation circuit 740 may be provided to the duty correction circuit 610 in FIG. 6. Thus, the duty correction circuit 610 may correct the duty rates of the positive and negative input clock signals CLK_IN and /CLK_IN based on the duty control code CD_CTR in the duty training operation mode to generate the positive and negative output clock signals CLK_OUT and /CLK_OUT.

The first charge/discharge circuit 710, the second charge/discharge circuits 720, the voltage comparison circuit 703, and the code generation circuit 740 may perform operations corresponding to the duty training operation mode. Hereinafter, the duty cycle correction operation in the at least one normal operation mode after the duty training operation mode may be illustrated. As mentioned above, the duty cycle correction operation may include an operation method using the duty voltage and an operation method using the storage voltage.

In the operation method using the duty voltage, the first and second charge/discharge circuits 710 and 720 may store the first duty voltage corresponding to the duty rate of the duty training operation mode and the second duty voltage corresponding to the at least one normal operation mode in the at least one normal operation mode.

Particularly, the first charge/discharge circuit 710 may store the duty rate of the duty training operation mode as the first duty voltage. Because the first charge/discharge circuit 710 may store the first output voltage OV1 corresponding to the first duty voltage in the duty training operation mode, the first charge/discharge circuit 710 may output the first output voltage OV1 substantially the same as the duty training operation mode in the at least one normal operation mode. The second charge/discharge circuit 720 may store the duty rate of the at least one normal operation mode as the second duty voltage. The second charge/discharge circuit 720 may output the second duty voltage as the second output voltage OV2. The operation for storing the second duty voltage may be illustrated with reference to FIG. 4. Thus, any further illustrations with respect to the storage operation may be omitted herein for brevity. The voltage comparison circuit 730 may compare the first and second output voltages OV1 and OV2 corresponding to the first and second duty voltages with each other.

Therefore, the duty cycle correction circuit 600 of example embodiments may compare the first output voltage OV1 corresponding to the first duty voltage in the duty training operation mode with the second output voltage OV2 corresponding to the second duty voltage in the at least one normal operation mode. As mentioned above, the first and second duty voltages may correspond to the difference between the operation power voltages V_INN based on the operation mode. That is, the duty cycle correction circuit 600 may perform the duty cycle correction operation through the difference between the operation power voltages V_INN based on the operation mode.

In the operation method using the storage voltage, the first and second charge/discharge circuits 710 and 720 may store the first storage voltage corresponding to the operation power voltage V_INN of the duty training operation mode and the second storage voltage corresponding to the operation power voltage V_INN of the at least one normal operation mode.

Particularly, the first charge/discharge circuit 710 may store the first storage voltage corresponding to the operation power voltage V_INN of the duty training operation mode. The first charge/discharge circuit 710 may then output the first output voltage OV1. The second charge/discharge circuit 720 may store the second storage voltage corresponding to the operation power voltage V_INN of the at least one normal operation mode. The second charge/discharge circuit 720 may then output the second output voltage OV2. The operation for storing the first and second storage voltages may be illustrated with reference to FIGS. 1 and 4. Thus, any further illustrations with respect to the storage operation may be omitted herein for brevity. The voltage comparison circuit 730 may compare the first and second output voltages OV1 and OV2 corresponding to the first and second storage voltages with each other.

Therefore, the storage cycle correction circuit 600 of example embodiments may compare the first output voltage OV1 corresponding to the first storage voltage in the duty training operation mode with the second output voltage OV2 corresponding to the second storage voltage in the at least one normal operation mode. As mentioned above, the first and second storage voltages may correspond to the difference between the operation power voltages V_INN based on the operation mode. That is, the storage cycle correction circuit 600 may perform the storage cycle correction operation through the difference between the operation power voltages V_INN based on the operation mode.

In example embodiments, the first charge/discharge circuit 710 may store the first duty voltage or the first storage voltage corresponding to the duty training operation mode. The second charge/discharge circuit 720 may store the second duty voltage or the second storage voltage corresponding to the at least one normal operation mode. Additionally, the duty cycle correction circuit 600 may store the first duty voltage or the first storage voltage corresponding to the duty training operation mode in the second charge/discharge circuit 720. The duty cycle correction circuit 600 may store the second duty voltage or the second storage voltage corresponding to the at least one normal operation mode in the first charge/discharge circuit 710.

According to example embodiments, the duty cycle correction circuit 600 may compare the difference between the operation power voltages V_INN based on the operation mode to correct the duty rates of the positive and negative output clock signals CLK_OUT and /CLK_OUT corresponding to the positive and negative input clock signals CLK_IN and /CLK_IN.

Figure 8:
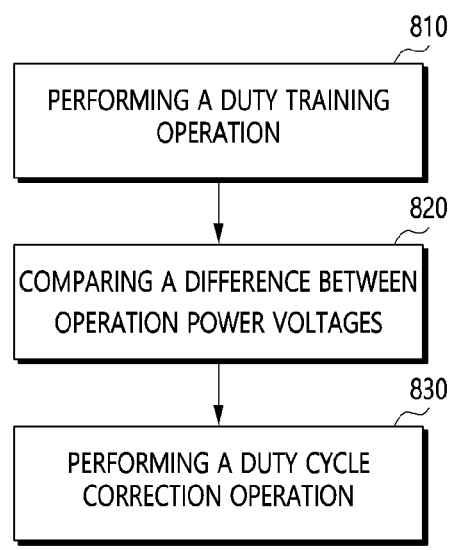
FIG. 8 is a view illustrating a method of operating a duty cycle correction circuit in accordance with example embodiments.

FIG. 8 is a view illustrating a method of operating a duty cycle correction circuit in accordance with example embodiments.

Referring to FIGS. 1 and 8, the operation method 800 of the duty cycle correction circuit may include an operation 810 for performing the duty training operation, an operation 820 for comparing the difference between the operation power voltages and an operation 830 for performing the duty cycle correction operation.

The operation 810 for performing the duty training operation may include performing the duty training operation with respect to the input clock signal CLK_IN. The operation 810 for forming the duty training operation may include generating the duty control code CD_CTR based on the duty rate of the output clock signal CLK_OUT and generating the output clock signal CLK_OUT having a controlled duty rate based on the duty control code CD_CTR. The operation 810 for performing the duty training operation may include setting the duty rate of the output clock signal CLK_OUT before performing the at least one normal operation.

The operation 820 for comparing the difference between the operation power voltages may include comparing the difference between the operation power voltages V_INN in the duty training operation and the at least one normal operation. The operation 820 for comparing the difference between the operation power voltages may use at least one of the storage voltage and the duty voltage.

Particularly, as mentioned above with reference to FIGS. 1, 4, and 7, the operation 820 for comparing the difference between the operation power voltages may use the first storage voltage V1 and the second storage voltage V2 corresponding to the operation power voltages V_INN in the duty training operation and the at least one normal operation. Further, as mentioned above with reference to FIGS. 4 and 7, the operation 820 for comparing the difference between the operation power voltages may use the first duty voltage DV1 and the second duty voltage DV2 corresponding to the duty rates that include the operation power voltages V_INN in the duty training operation and the at least one normal operation. As mentioned above with reference to FIG. 5, the operation 820 for comparing the difference between the operation power voltages may use the first duty code CD1 and the second duty code CDV obtained by coding the duty rates that include the operation power voltages V_INN in the duty training operation and the at least one normal operation. The operation 820 for comparing the difference between the operation power voltages may include generating the duty control code CD_CTR based on the comparison result.

The operation 830 for performing the duty cycle correction operation may include generating the output clock signal CLK_OUT having the corrected duty rate with respect to the input clock signal CLK_IN based on the comparison result of the operation 820. The operation 830 for performing the duty cycle correction operation may include generate the output clock signal CLK_OUT having the desired duty rate based on the duty control code CD_CTR as the comparison result of the operation 820.

According to example embodiments, the duty cycle correction circuit may include the difference between the operation power voltages V_INN with respect to the duty training operation and the at least one normal operation to rapidly and accurately perform the duty cycle correction operation.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A duty cycle correction circuit comprising:
a duty correction circuit configured to correct a duty rate of an input clock signal based on a duty control code and configured to generate an output clock signal;
an information generation circuit configured to compare a difference between operation power voltages based on an operation mode and configured to generate voltage information; and
a duty control circuit configured to receive the voltage information from the information generation circuit and configured to generate the duty control code that includes the voltage information based on a duty rate of the output clock signal.

2. The duty cycle correction circuit of claim 1, wherein the operation mode comprises a duty training operation mode and at least one normal operation mode.

3. The duty cycle correction circuit of claim 2, wherein the information generation circuit comprises:
a first charge circuit configured to store the operation power voltage as a first storage voltage through a charge operation in the duty training operation mode;
a second charge circuit configured to store the operation power voltage as a second storage voltage through a charge operation in the at least one normal operation mode; and
a voltage comparison circuit configured to compare the first storage voltage to the second storage voltage to generate the voltage information.

4. The duty cycle correction circuit of claim 3, wherein the second charge circuit is selectively activated based on a plurality of the normal operation modes to store a storage voltage corresponding to each of the normal operation modes.

5. The duty cycle correction circuit of claim 3, wherein at least one of the first and second charge circuits shares a capacitor for performing a charge/discharge operation of the duty control circuit.

6. A duty cycle correction circuit comprising:
a duty correction circuit configured to correct a duty rate of an input clock signal based on a duty control code and configured to generate an output clock signal; and
a duty control circuit configured to generate the duty control code based on a duty rate of the output clock signal, the duty control code including a difference between operation power voltages based on an operation mode.

7. The duty cycle correction circuit of claim 6, wherein the operation mode comprises a duty training operation mode and at least one normal operation mode.

8. The duty cycle correction circuit of claim 7, wherein the duty control circuit comprises:
- a first charge/discharge circuit configured to store the duty rate of the output clock signal as a first duty voltage through a charge/discharge operation in the duty training operation mode;
- a second charge/discharge circuit configured to store the duty rate of the output clock signal as a second duty voltage through a charge/discharge operation in the at least one normal operation mode;
- a voltage comparison circuit configured to compare the first duty voltage to the second duty voltages; and
- a code generation circuit configured to generate the duty control code by coding an output signal of the voltage comparison circuit.

9. The duty cycle correction circuit of claim 8, wherein the code generation circuit is configured to code the first duty voltage in the duty training operation mode, thereby generating the duty control code, and
wherein the code generation circuit is configured to, in the at least one normal operation mode, include a difference between the first and second duty voltages in the duty control code to code the duty control code.

10. The duty cycle correction circuit of claim 8, wherein the second charge/discharge circuit is selectively activated, based on a plurality of normal operation modes, to store a duty voltage corresponding to each of the normal operation modes.

11. The duty cycle correction circuit of claim 8, wherein the first charge/discharge circuit is configured to store a first storage voltage corresponding to the operation power voltage in the duty training operation mode,
the second charge/discharge circuit is configured to store a second storage voltage corresponding to the operation power voltage in the at least one normal operation mode, and
the voltage comparison circuit is configured to compare the first storage voltage to the second storage voltage.

12. The duty cycle correction circuit of claim 7, wherein the duty control circuit comprises:
- a charge/discharge circuit configured to store the duty rate of the output clock signal through a charge/discharge operation;
- a code generation circuit configured to code an output voltage from the charge/discharge circuit;
- a first code storage circuit configured to store an output code from the code generation circuit as a first duty code in the duty training operation mode;
- a second code storage circuit configured to store an output code from the code generation circuit as a second duty code in the at least one normal operation mode; and
- a code calculation circuit configured to calculate the first and second duty codes to generate the duty control code.

13. The duty cycle correction circuit of claim 12, wherein the second code storage circuit is selectively activated based on a plurality of the normal operation modes to store a duty code corresponding to each of the normal operation modes.

14. The duty cycle correction circuit of claim 12, wherein the first code storage circuit is configured to code and store a first storage voltage corresponding to the operation power voltage in the duty training operation mode,
the second code storage circuit is configured to store a second storage voltage corresponding to the operation power voltage in the at least one normal operation mode, and
the code calculation circuit is configured to calculate the coded first and second storage voltages.

15. The duty cycle correction circuit of claim 7, wherein the input clock signal comprises a positive input clock signal and a negative input clock signal and the output clock signal comprises a positive output clock signal corresponding to the positive input clock signal and a negative output clock signal corresponding to the negative input clock signals, and
wherein the duty control circuit is configured to:
- compare the positive output clock signal with the negative output clock signal in the duty training operation mode to generate the duty control code, and
- in the at least one normal operation mode, include, in the duty control code, a difference between the operation power voltages, which correspond to the duty training operation mode and the at least one normal operation mode.

16. The duty cycle correction circuit of claim 15, wherein the duty control circuit comprises:
- a first charge/discharge circuit configured to store a duty rate of the positive output clock signal as a first output voltage through a charge/discharge operation in the duty training operation mode;
- a second charge/discharge circuit configured to store a duty rate of the negative output clock signal as a second output voltage through a charge/discharge operation in the at least one normal operation mode;
- a voltage comparison circuit configured to compare the first output voltage to the second output voltage; and
- a code generation circuit configured to code an output signal from the voltage comparison circuit to generate the duty control code.

17. The duty cycle correction circuit of claim 16, wherein each of the first and second charge/discharge circuits is configured to store a first duty voltage corresponding to a duty rate of the duty training operation mode and a second duty voltage corresponding to a duty rate of the at least one normal operation mode in the at least one normal operation mode,
and the voltage comparison circuit is configured to compare the first duty voltage to the second duty voltage.

18. The duty cycle correction circuit of claim 16, wherein each of the first and second charge/discharge circuits are configured to store a first storage voltage corresponding to the operation power voltage of the duty training operation mode and a second storage voltage corresponding to the operation power voltage of the at least one normal operation mode in the at least one normal operation mode, and
wherein the voltage comparison circuit compares the first storage voltage to the second storage voltage.

19. A method of operating a duty cycle correction circuit, the method comprising:
- performing a duty training operation with respect to an input clock signal;
- comparing a difference between operation power voltages in the duty training operation and at least one normal operation; and
- performing a duty cycle correction operation to generate an output clock signal having a corrected duty rate with respect to the input clock signal based on a comparison result.

20. The method of claim 19, wherein comparing the difference between the operation power voltages comprises using at least one of a storage voltage corresponding to the operation power voltage of the duty training operation and the at least one normal operation, a duty voltage corresponding to a duty rate that includes the operation power voltage, and a duty code that is obtained by coding a duty rate that includes the operation power voltage.

\* \* \* \* \*